(12) United States Patent
Zhang et al.

(10) Patent No.: US 11,637,266 B2
(45) Date of Patent: Apr. 25, 2023

(54) DISPLAY SUBSTRATE, MANUFACTURING METHOD THEREOF, AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Zhang, Beijing (CN); Long Chen, Beijing (CN); Yifan Yang, Beijing (CN); Peng Cao, Beijing (CN); Cheng Zeng, Beijing (CN); Yingchang Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 268 days.

(21) Appl. No.: 16/619,161

(22) PCT Filed: Jun. 5, 2019

(86) PCT No.: PCT/CN2019/090132
§ 371 (c)(1),
(2) Date: Dec. 4, 2019

(87) PCT Pub. No.: WO2020/143158
PCT Pub. Date: Jul. 16, 2020

(65) Prior Publication Data
US 2021/0359249 A1    Nov. 18, 2021

(30) Foreign Application Priority Data
Jan. 10, 2019  (CN) .......................... 201910023876.0

(51) Int. Cl.
H01L 51/52      (2006.01)
H01L 27/32      (2006.01)
H01L 51/56      (2006.01)

(52) U.S. Cl.
CPC ...... H01L 51/5228 (2013.01); H01L 27/3246 (2013.01); H01L 51/56 (2013.01);
(Continued)

(58) Field of Classification Search
None
See application file for complete search history.

(56) References Cited

U.S. PATENT DOCUMENTS 10,333,096 B2    6/2019  Tang
2004/0113550 A1  6/2004  Adachi et al.
(Continued)

FOREIGN PATENT DOCUMENTS

CN    1708199 A    12/2005
CN    101800241 A   8/2010
(Continued)

OTHER PUBLICATIONS

Office Action dated May 25, 2020, issued in counterpart CN Application No. 201910023876.0, with English translation (15 pages).
(Continued)

*Primary Examiner* — Evren Seven
(74) *Attorney, Agent, or Firm* — WHDA, LLP

(57) ABSTRACT

The display substrate may include a base substrate, a plurality of sub-pixels in an array on the base substrate, an isolation layer on a side of a second electrode layer opposite from the light-emitting layer, and an auxiliary conductive layer on a side of the isolation layer opposite from the second electrode layer. The isolation layer may comprise via openings, orthographic projection of each of the via open-
(Continued)

ings on the base substrate may substantially overlap with orthographic projection of the pixel defining layer on the base substrate, and the auxiliary conductive layer may be connected to the second electrode layer through the via openings.

11 Claims, 6 Drawing Sheets

(52) U.S. Cl.
CPC .. *H01L 2227/323* (2013.01); *H01L 2251/306* (2013.01); *H01L 2251/308* (2013.01); *H01L 2251/558* (2013.01)

(56) References Cited

U.S. PATENT DOCUMENTS

| | | | |
|---|---|---|---|
| 2014/0111652 A1* | 4/2014 | So | H01L 27/288 348/164 |
| 2015/0115230 A1 | 4/2015 | Yoon et al. | |
| 2015/0349291 A1 | 12/2015 | Song et al. | |
| 2016/0104859 A1 | 4/2016 | Kim et al. | |
| 2016/0329521 A1 | 11/2016 | Kim et al. | |
| 2019/0027702 A1 | 1/2019 | You et al. | |
| 2019/0181188 A1* | 6/2019 | Youn | H01L 27/3262 |
| 2020/0098840 A1 | 3/2020 | Hou | |

FOREIGN PATENT DOCUMENTS

| | | |
|---|---|---|
| CN | 102479799 A | 5/2012 |
| CN | 102738403 A | 10/2012 |
| CN | 103325812 A | 9/2013 |
| CN | 104022139 A | 9/2014 |
| CN | 104051494 A | 9/2014 |
| CN | 106784375 A | 5/2017 |
| CN | 108539043 A | 9/2018 |
| CN | 207947279 U | 10/2018 |
| CN | 108807497 A | 11/2018 |
| CN | 108878688 A | 11/2018 |
| CN | 109728065 A | 5/2019 |
| CN | 109742122 A | 5/2019 |
| WO | 2015/180381 A1 | 12/2015 |
| WO | 2018/149106 A1 | 8/2018 |

OTHER PUBLICATIONS

Office Action dated Nov. 17, 2020, issued in counterpart CN Application No. 201910023876.0, with English Translation. (12 pages).

International Search Report dated Aug. 27, 2019, issued in Application No. PCT/CN2019/090132 (11 pages).

The Extended European Search Report dated Nov. 16, 2022, issued in counterpart to EP Application No. 19858625.7. (8 pages).

* cited by examiner

Prior Art

Prior Art

DISPLAY SUBSTRATE, MANUFACTURING METHOD THEREOF, AND DISPLAY PANEL

CROSS-REFERENCE TO RELATED APPLICATION

This application claims benefit of the filing date of Chinese Patent Application No. 201910023876.0 filed on Jan. 10, 2019, the disclosure of which is hereby incorporated in its entirety by reference.

TECHNICAL FIELD

The present disclosure relates to the field of display technology, and in particular, to a display substrate, a method of manufacturing the display substrate, and a display apparatus.

BACKGROUND

An organic light emitting diode (OLED) display panel in related art includes sub-pixels distributed in an array, wherein each sub-pixel includes a light-emitting layer, an anode under the light-emitting layer, and a cathode on the light-emitting layer. Cathodes of the respective sub-pixels are connected to one another to form an integral cathode layer. A driving circuit is connected to the cathode layer to provide a cathode voltage for the cathode layer (ie, the cathode of each sub-pixel).

BRIEF SUMMARY

One embodiment of the present disclosure provides a display substrate. The display substrate may include a base substrate; a plurality of sub-pixels in an array on the base substrate, wherein adjacent sub-pixels are separated by a pixel defining layer, each of the plurality of sub-pixels includes a first electrode, a light-emitting layer and a second electrode in a direction away from the base substrate, the second electrode of each of the plurality of sub-pixels is connected to one another to form a second electrode layer; an isolation layer on a side of the second electrode layer opposite from the light-emitting layer; and an auxiliary conductive layer on a side of the isolation layer opposite from the second electrode layer. The isolation layer comprises via openings, orthographic projection of each of the via openings on the base substrate substantially overlaps with orthographic projection of the pixel defining layer on the base substrate, and the auxiliary conductive layer is connected to the second electrode layer through the via openings.

Optionally, a thickness of the isolation layer is in a range from about 10 nm to about 90 nm.

Optionally, the via openings comprises a plurality of via openings within some of intervals among the plurality of sub-pixels, respectively.

Optionally, the via openings comprises a plurality of via openings within all of intervals among the plurality of sub-pixels, respectively, and all of the intervals among the plurality of sub-pixels in a first direction are the same.

Optionally, the plurality of sub-pixels constitutes a plurality of pixels, intervals among the plurality of sub-pixels in a first direction within a same pixel is smaller than intervals among the plurality of pixels in the first direction, and the via openings are within the intervals among the plurality of pixels, respectively.

Optionally, each of the plurality of pixels comprises a blue sub-pixel, a red sub-pixel, and a green sub-pixel, and an interval between the blue sub-pixel and the red sub-pixel is smaller than an interval between the red sub-pixel and the green sub-pixel.

Optionally, the isolation layer is a capping layer.

Optionally, a material of the capping layer comprises molybdenum trioxide.

Optionally, the display substrate is an organic light emitting diode display substrate, the first electrode is an anode, and the second electrode is a cathode.

Optionally, the second electrode is a metal electrode, the auxiliary conductive layer is a transparent conductive layer, the isolation layer is a transparent isolation layer, and light emitted by the light-emitting layer is emitted from one side of the second electrode.

Optionally, the auxiliary conductive layer comprises a material selected from the group consisting of indium tin oxide, indium zinc oxide, indium gallium zinc oxide and tin oxide.

One embodiment of the present disclosure is a display panel, comprising the display substrate according to one embodiment of the present disclosure.

One embodiment of the present disclosure is a display apparatus comprising the display panel according to one embodiment of the present disclosure.

One embodiment of the present disclosure is a method of fabricating a display substrate, comprising providing a base substrate; forming a plurality of sub-pixels in an array on the base substrate, wherein adjacent sub-pixels are separated by a pixel defining layer 25, each of the plurality of sub-pixels includes a first electrode, a light-emitting layer and a second electrode in a direction away from the base substrate, the second electrode of each of the plurality of sub-pixels is connected to one another to form a second electrode layer; forming an isolation layer on a side of the second electrode layer opposite from the light-emitting layer; and forming an auxiliary conductive layer on a side of the isolation layer opposite from the second electrode layer. The isolation layer comprises via openings, orthographic projection of each of via holes via openings on the base substrate substantially overlaps with orthographic projection of the pixel defining layer on the base substrate, and the auxiliary conductive layer is connected to the second electrode layer through the via openings.

Optionally, the isolation layer is formed by an evaporation technique.

Optionally, a mask comprising a plurality of opening areas and a plurality of non-opening areas is used in the evaporation technique, the isolation layer is formed on the side of the second electrode layer within the plurality of opening areas of the mask, and the via openings are formed on the side of the second electrode layer within the plurality of non-opening areas of the mask.

Optionally, the plurality of opening areas of the mask are in a one-to-one correspondence with the plurality of sub-pixels, respectively.

Optionally, orthographic projection of each of the plurality of sub-pixels on the base substrate falls within orthographic projection of each of the plurality of opening areas of the mask on the base substrate, respectively.

Optionally, the plurality of sub-pixels constitutes a plurality of pixels, each of the plurality of pixels comprises a blue sub-pixel, a red sub-pixel, and a green sub-pixel, and the plurality of opening areas of the mask is in a one-to-one correspondence with the plurality of pixels, respectively.

Optionally, the auxiliary conductive layer is formed using a chemical vapor deposition technique or a sputtering technique.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1A:
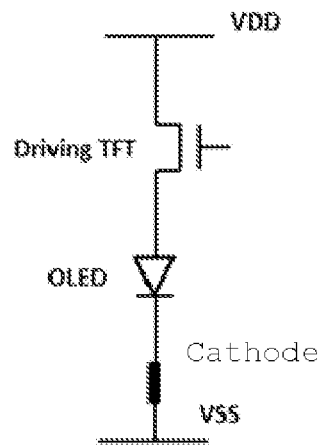
FIG. 1a is a schematic diagram of a driving circuit of an organic light emitting diode display panel of the related art.

In order to make the objects, technical solutions, and advantages of the embodiments of the present disclosure more apparent, the technical solutions according to the embodiments of the present disclosure will be described below clearly and fully with reference to the drawings, but the embodiments described below are only particular embodiments, which are not intended to represent all embodiments of the present disclosure. Based upon the embodiments in the present disclosure, other embodiments which will be apparent to those skilled in the art are within the scope of the present disclosure.

When an element and an embodiment of the present disclosure are introduced, the articles "a", "an", "the" and "said" are intended to indicate that one or more elements are present. The terms "comprising", "including", "containing" and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

In the description of the present disclosure, the terms "center," "horizontal," "vertical," "length," "width," "thickness," "upper," "lower," "front," "back," "left," "right," "top," "bottom," "inner," "outer," or the like are based on the orientation or positional relationship shown in the drawings. They are used merely for convenience of description and simplifying description of the present disclosure, but not to indicate or imply that the indicated apparatus or element must have a specific orientation, or be constructed and operated in a specific orientation, therefore cannot be construed as a limitation of the present disclosure.

In addition, the terms "first" and "second" or the like are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

A numerical range modified by "about" herein means that the upper and lower limits of the numerical range can vary by 10% thereof. A numeric value modified by "about" herein means that the numeric value can vary by 10% thereof.

In an organic light emitting diode display panel of prior art, each sub-pixel has a different distance from the chip. A current of a cathode of a sub-pixel farther from the chip needs flow a long distance in the cathode layer. Since the cathode layer has a certain resistance, a voltage drop occurs. As such, a voltage difference across a source and a drain of a driving transistor of the sub-pixel farther away from the chip is smaller than a corresponding voltage difference of the sub-pixel closer to the chip, thereby resulting in different currents in the different sub-pixels under a same driving voltage. Accordingly, brightness of the organic light emitting diode display panel becomes uneven.

Figure 1B:
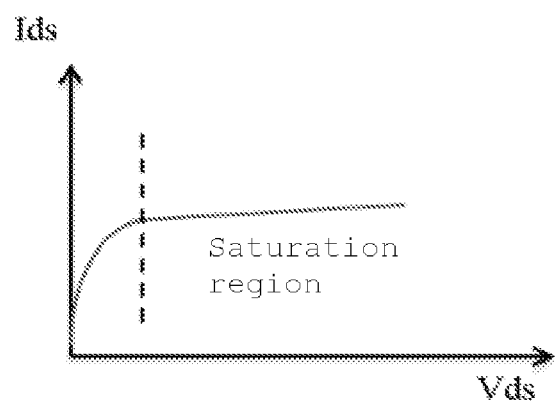
FIG. 1b is a graph of characteristic properties of a driving transistor of an organic light emitting diode display panel of the related art.

In an organic light emitting diode display panel, as shown in FIG. 1a and FIG. 1b, a current flowing through a light-emitting structure such as an OLED is controlled by a driving TFT. When the voltage difference Vds between the source and the drain of the driving transistor reaches a certain value, the driving transistor operates in a saturated region, and the current Ids flowing through the source and drain is supposed to be affected only by the gate voltage. However, in practice, the driving transistor is also affected by other factors such as channel modulation effect, etc., so that even in the situation region, the current $I_{ds}$ flowing through the source and drain is affected by the voltage difference between the source and the drain, $V_{ds}$.

The OLED display panel includes a plurality of sub-pixels (such as millions of sub-pixels), wherein a cathode voltage drop of a sub-pixel farther from the chip (IC) is greater than a cathode voltage drop of a sub-pixel closer to the chip, thereby resulting in the voltage difference $V_{ds}$ between the source and the drain of the driving transistor of the sub-pixel farther away from the IC being smaller than the voltage difference $V_{ds}$ between the source and the drain of the driving transistor of the sub-pixel closer to the IC. As a result, the current of the sub-pixel farther away from the IC is smaller than the current of the sub-pixel closer to the IC, thereby causing difference in brightness of the OLED display panel. That is, the uniformity of brightness of the OLED display panel is not good.

Figure 1C:
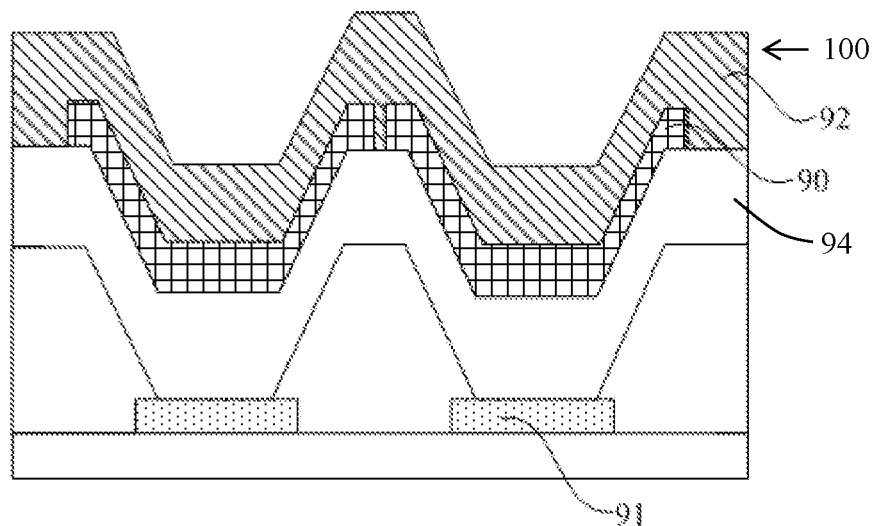
FIG. 1c is a schematic structural view of an organic light emitting diode display substrate of the related art.

FIG. 1c shows an organic light emitting diode display substrate, which adopts a top emission structure. Each sub-pixel includes a light-emitting layer 90, a layer 94, an anode 91 under the light-emitting layer 90, and a cathode 92 on the light-emitting layer 90. The cathodes 92 of the sub-pixels are connected to one another to form an integral cathode layer 100, and the integral cathode layer 100 is connected to a driving circuit. In the top-emitting OLED display substrate, the transparent cathode 92 plays a very important role in its performance. The cathode 92 has characteristics such as good electron injectability, good electrical conductivity, and low light absorption. The cathode 92 is usually made of a thin film metal material. A sheet resistance R of the thin film metal cathode 92 satisfies the following formula:

$$R=\rho/d$$

Wherein $\rho$ represents the resistivity of the cathode 92, and d represents the thickness of the cathode 92.

According to the above formula, the sheet resistance of the cathode 92 can be reduced by increasing the thickness of the cathode 92. However, increasing the thickness of the cathode 92 can cause problems such as an increase in light absorbance of the cathode 92 and a change in color shift, thereby affecting the luminescent properties of the OLED display substrate.

Figure 1D:
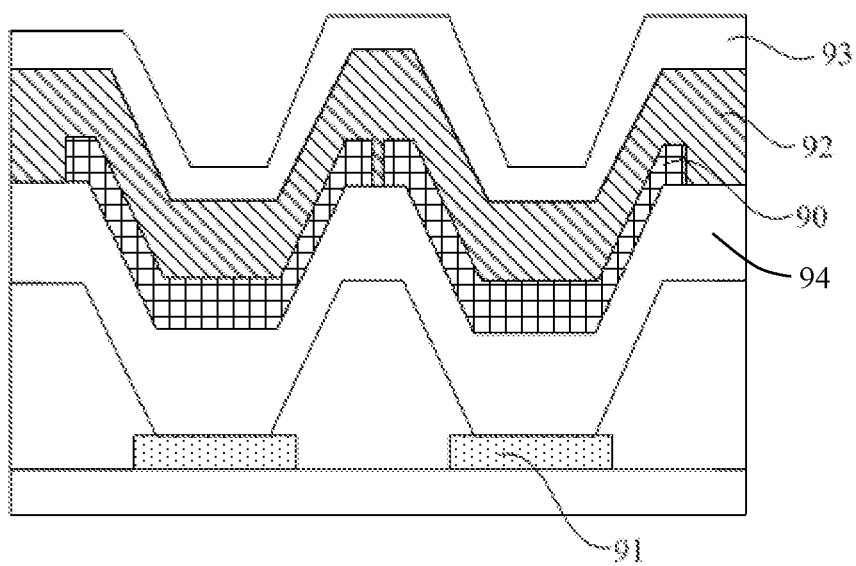
FIG. 1d is a schematic structural view of an organic light emitting diode display substrate of the related art.

The sheet resistance of the cathode 92 can also be reduced by reducing the resistivity of the cathode 92. For example, a transparent auxiliary conductive layer 93 may be formed on the cathode 92 to be connected in parallel with the cathode 92 to reduce the resistance of the overall structure, as shown in FIG. 1d. However, the auxiliary conductive layer 93 is usually formed by a process such as sputtering or chemical vapor deposition CVD. Such a process may adversely affect the thin film metal cathode 92 and/or the light-emitting layer 90 underneath during the formation of the auxiliary conductive layer 93. For example, since the auxiliary conductive layer 93 needs to be formed under a high temperature, the excessive high temperature may change a shape of the cathode and morphology the organic light-emitting layer, thereby affecting the display performance of the OLED display substrate.

Figure 2:
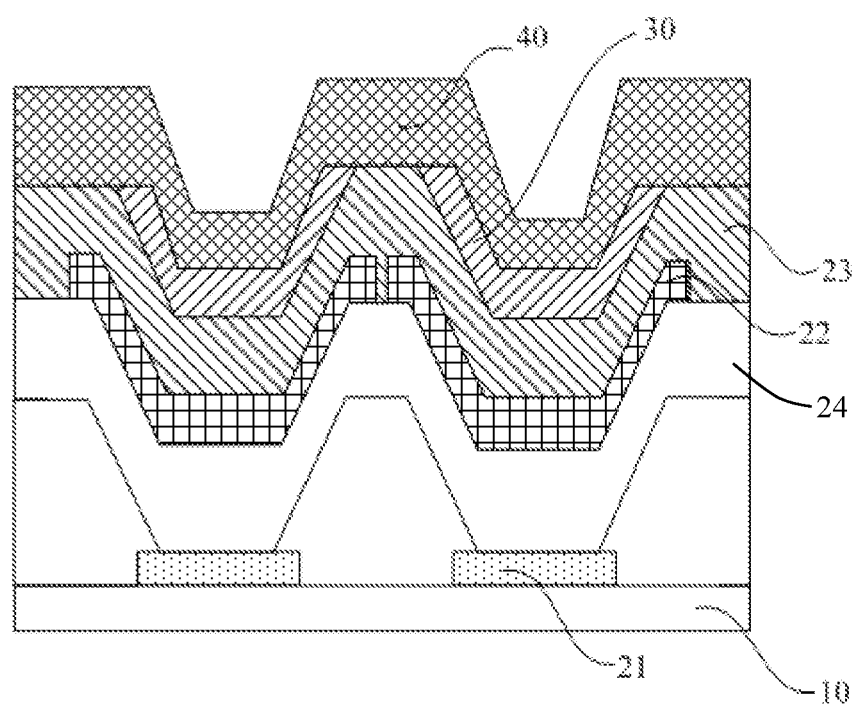
FIG. 2 is a schematic structural view of an organic light emitting diode display substrate according to one embodiment of the present disclosure.
Figure 3A:
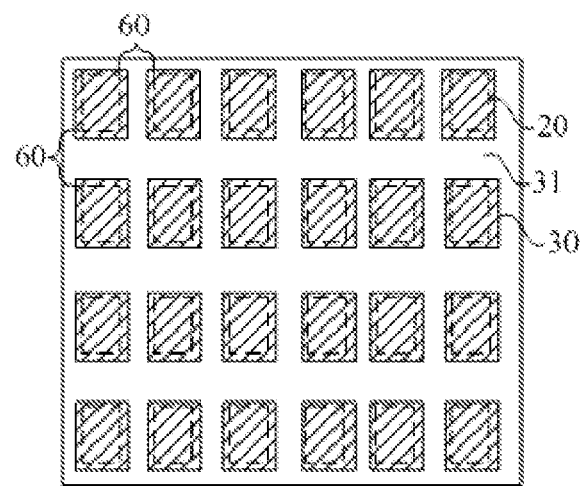
FIG. 3a is a top plan view showing arrangement of sub-pixels and an isolation layer of an organic light emitting diode display substrate according to one embodiment of the present disclosure.
Figure 3B:
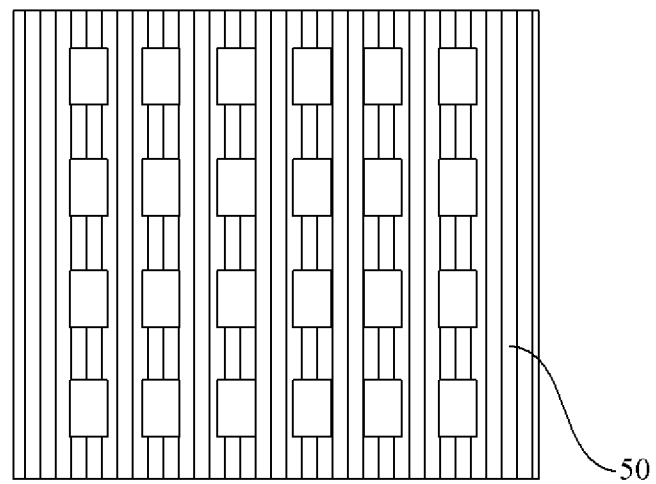
FIG. 3b is a schematic top plan view of a mask for forming an isolation layer of an organic light emitting diode display substrate according to one embodiment of the present disclosure.
Figure 4A:
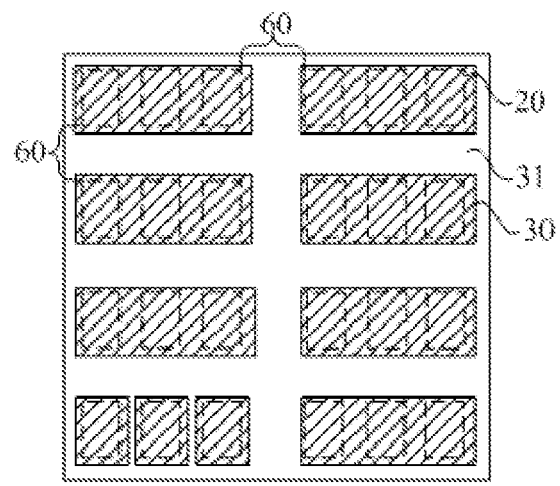
FIG. 4a is a top plan view showing arrangement of sub-pixels of an organic light emitting diode display substrate according to one embodiment of the present disclosure.
Figure 4B:
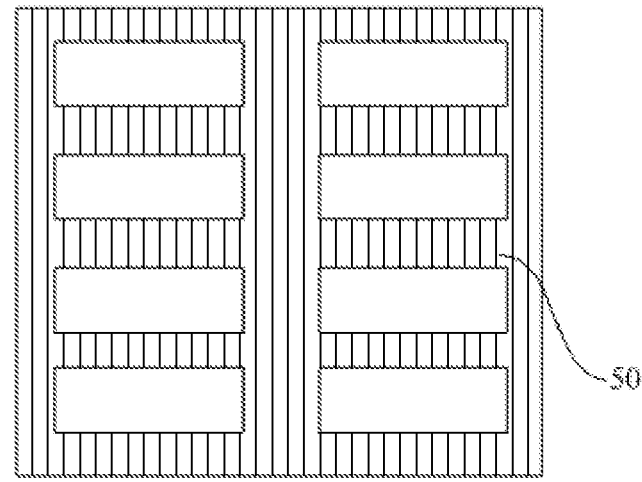
FIG. 4b is a top plan view showing a mask forming an isolation layer of an organic light emitting diode display substrate according to one embodiment of the present disclosure.

Some embodiments of the present disclosure provide a display substrate, as shown in FIG. 2, FIG. 3 and FIG. 4 respectively. The mask 50 in FIG. 3b corresponds to the organic light-emitting diode display substrate in FIG. 3a, and the mask 50 in FIG. 4b corresponds to the organic light-emitting diode display substrate in FIG. 4a.

The display substrate provided by some embodiments of the present disclosure includes a base substrate 10 and a plurality of sub-pixels 20 disposed at intervals on the base substrate. An interval 60 is present between each adjacent sub-pixels 20. Each sub-pixel 20 includes a first electrode 21, a layer 24, a light-emitting layer 22, and a second electrode 23 stacked in a direction away from the base substrate 10. The second electrode 23 of each sub-pixel 20 is integrally connected to one another to form a second electrode layer 123.

In some embodiments, the display substrate provided further includes an insulating isolation layer 30 on the side of the second electrode layer opposite from the light-emitting layer 22 and an auxiliary conductive layer 40 on the side of the isolation layer 30 opposite from the second electrode layer 123. The isolation layer 30 covers all the second electrodes 23. Furthermore, the isolation layer 30 is provided with via openings 31 at least at some of the intervals 60 between adjacent sub-pixels. The auxiliary conductive layer 40 is connected to the second electrode layer 123 through the via openings 31.

In some embodiment, the isolation layer comprises via openings, orthographic projection of each of the via openings on the base substrate substantially overlaps with orthographic projection of the pixel defining layer on the base substrate, and the auxiliary conductive layer is connected to the second electrode layer through the via openings.

In some embodiments, the via openings comprises a plurality of via holes within some of intervals among the plurality of sub-pixels, respectively.

In some embodiment, the via openings comprises a plurality of via holes within all of intervals among the plurality of sub-pixels, respectively, and all of the intervals among the plurality of sub-pixels in a first direction are the same. The first direction may be a row direction or a column direction.

In some embodiments, the plurality of sub-pixels constitutes a plurality of pixels, intervals among the plurality of sub-pixels in a first direction within a same pixel is smaller than intervals among the plurality of pixels in the first direction, and the via openings are within the intervals among the plurality of pixels, respectively. The first direction may be a row direction or a column direction.

In some embodiment, each of the plurality of pixels comprises a blue sub-pixel, a red sub-pixel, and a green sub-pixel, and an interval between the blue sub-pixel and the red sub-pixel is smaller than an interval between the red sub-pixel and the green sub-pixel.

In some embodiments, the display substrate is an organic light-emitting diode display substrate.

In the organic light-emitting diode display substrate, the structure in the longitudinal direction is the base substrate 10, the first electrode 21, the light-emitting layer 22, the second electrode layer, the isolation layer 30, and the auxiliary conductive layer 40. The first electrodes 21 and the light-emitting layers 22 of different sub-pixels 20 are spaced and distributed in an array. The portion of the second electrode layer corresponding to each of the first electrodes 21 is the second electrode 23 of each of the sub-pixels 20 respectively.

In some embodiments, the insulating isolation layer 30 separates the second electrode 23 in each sub-pixel 20 from the auxiliary conductive layer 40. The isolation layer 30 has via openings 31 in the intervals 60, so that the auxiliary conductive layer 40 is connected to the second electrode layer in the intervals 60. That is, the second electrode layer and the auxiliary conductive layer 40 are connected in parallel, thereby reducing the sheet resistance of the overall structure of the second electrodes 23 and the auxiliary conductive layer 40.

In the display substrate of some embodiments, the auxiliary conductive layer 40 is connected to the second electrode layer in the intervals 60, and the auxiliary conductive layer 40 is connected in parallel with the second electrode layer, thereby reducing sheet resistance of the overall structure of the second electrode layer and the auxiliary conductive layer 40. Accordingly, the voltage drop generated by the second electrode layer is reduced. Since the voltage drop generated by the second electrode layer is reduced, the voltage of the second electrode 23 of the sub-pixel 20 farther away from the power supply unit is approximately equal to the voltage of the second electrode 23 of the sub-pixel 20 closer to the power supply unit. Accordingly, the current in different sub-pixels 20 under the same driving voltage is approximately the same, thereby making brightness of the display panel uniform.

In some embodiment, the insulating isolation layer 30 separates the second electrode 23 of each sub-pixel 20 from the auxiliary conductive layer 40. As such, the high temperature or other factors in the process of forming the auxiliary conductive layer 40 (sputtering or chemical vapor deposition) are prevented from adversely affecting the light-emitting layer 22 and the second electrode 23, thereby, for example, avoiding changing the shape of the second electrode 23 and the morphology of the light-emitting layer 22. The isolation layer 30 between the sub-pixels 20 is provided with via openings 31. The second electrode layer located in the interval 60 may be affected by the formation process of the auxiliary conductive layer 40, but the interval 60 does not emit light. Thus, even if the second electrode layer in the interval 60 is affected, the display performance of the display substrate is not affected. Accordingly, the via openings 31 located in the intervals 60 can be used as the connection structure of the auxiliary conductive layer 40 and the second electrodes 23.

In some embodiments, the display substrate can improve the uniformity of brightness while maintaining the illuminating performance.

In some embodiments, the display substrate is an organic light-emitting diode display substrate. The first electrode 21 is an anode, the second electrode 23 is a cathode, and the light-emitting layer 22 is an organic light-emitting layer. In the intervals 60 between adjacent sub-pixels, the cathode is connected to the auxiliary conductive layer 40.

The light-emitting layer 22 in the organic light-emitting diode display substrate is an organic light-emitting layer, and the cathode is generally made of aluminum or magnesium-silver alloy (AgMg). These structures are easily affected by the external environment such as a high temperature environment, which may change the shape of the cathode and the morphology of the organic light-emitting layer. Since the display substrate of the present embodiments has the isolation layer 30, the related problem can be reduced or eliminated.

In some embodiments, the second electrode 23 is a metal electrode, the auxiliary conductive layer 40 is a transparent conductive layer, and the isolation layer 30 is a transparent isolation layer 30. As such, the light of the light-emitting layer 22 can be emitted from one side of the second electrode 23. That is, the first electrode 21 is located below the light-emitting layer 22, the second electrode 23 is located above the light-emitting layer 22, and the display substrate is in a top emission mode.

Since the light emitted from the top-emitting display substrate is emitted from the top thereof, the thickness of the metal electrode (e.g., cathode) cannot be directly increased in order not to affect the light emission. As such, a transparent auxiliary conductive layer 40 may be provided.

In some embodiments, the isolation layer 30 has a thickness of about 10 nm to about 90 nm.

The specific thickness of the isolation layer 30 can be determined according to the refractive index of the material, the luminous efficiency of the sub-pixel 20 of each color, and the like. The isolation layer 30 can effectively protect the light-emitting layer 22 or other structures in the sub-pixel 20 from being affected by the process of forming the auxiliary conductive layer 40. Moreover, it should be avoided that the thickness of the entire display substrate becomes too large due to the excessive thickness of the isolation layer 30.

In some embodiments, the isolation layer 30 is a capping layer (CPL). The isolation layer 30 may be made of an organic or inorganic material having a high refractive index such as molybdenum trioxide ($MoO_3$). Thus, the second electrode 23 and the isolation layer 30 may form an optical anti-reflection film, which improves the reflectance, but not the light absorption, thereby improving luminosity of the display substrate.

By using the capping layer having via holes as the isolation layer 30, the connection structure between the auxiliary conductive layer 40 and the cathode or the protection structure of the sub-pixel 20 can be omitted, so that the structure of the display substrate is simple, thereby reducing difficulty of the manufacturing process.

In some embodiments, the via openings 31 of the isolation layer 30 are only provided within some of the intervals 60.

The connection structure between the auxiliary conductive layer 40 and the second electrode layer does not occupy all of the intervals 60. The connection structures are only within some of the intervals 60, respectively. For example, as shown in FIG. 4a, every three sub-pixels 20 corresponds to a single isolation layer 30, and the isolation layer 30 within the intervals 60 among the three sub-pixels 20 has no via hole. Correspondingly, an via hole of the mask 50 for preparing the isolation layer 30 corresponds to three sub-pixels 20, as shown in FIG. 4b.

In some embodiments, the via opening 31 of the isolation layer 30 is disposed within all of the intervals 60 respectively. That is, the non-via hole region of the isolation layer 30 corresponds to each of the sub-pixels 20. The connection region of the auxiliary conductive layer 40 and the second electrode layer occupies all of the intervals 60 respectively, which maximizes the connection region of the auxiliary conductive layer 40 and the second electrode layer. Thereby, the resistance of the second electrode 23 can be further reduced, and the uniformity of brightness of the display substrate can be further improved. In some embodiments, as shown in FIG. 3a, the non-via hole regions of the isolation layer 30 are in one to one correspondence with the sub-pixels 20. That is, each sub-pixel 20 corresponds to a whole piece of an isolation layer 30. Correspondingly, each via hole of the mask 50 used to prepare the isolation layer 30 corresponds to one sub-pixel 20, as shown in FIG. 3b.

In some embodiments, the display substrate further includes: a pixel defining layer between the respective sub-pixels 20 for spacing the respective sub-pixels 20 to avoid mutual influence of images between adjacent sub-pixels 20.

In some embodiments, each of the sub-pixels 20 may further include a hole transport layer, a hole blocking layer, an electron transport layer, an electron blocking layer or other OLED pixel structures.

Some embodiments of the present disclosure further provide a method for manufacturing the display substrate of the above embodiments. The manufacturing method may include the following steps:

Step S01 includes forming a first electrodes 21, a light-emitting layer 22, and a second electrode layer on the substrate 10.

In one embodiment, the first electrodes 21, the light-emitting layer 22, and the second electrode layer are formed on the base substrate 10 by an evaporation technique, thereby forming a plurality of sub-pixels 20 spaced apart.

Step S02 includes forming an isolation layer 30 on the second electrode layer.

In one embodiment, the isolation layer 30 may be formed using an evaporation technique. The conditions for the evaporation technique are relatively mild, and their influence on the cathode and the light-emitting layer 22 is relatively small in the process of forming the isolation layer 30. The isolation layer 30 is suitably formed by an evaporation technique.

In some embodiments, a mask 50 (FMM) is employed in the evaporation technique to form a pattern of the isolation layer 30. Wherein, before forming the isolation layer 30 by the evaporation technique, a mask 50 is covered on the second electrode layer, so that the formed isolation layer 30 cannot completely cover the second electrode layer. That is, the formed isolation layer 30 is provided with via openings 31 within at least some of the intervals 60. For example, the sub-pixels 20 of the display substrate are arranged as shown in FIG. 3a, and the mask 50 forming the isolation layer 30 corresponding thereto is as shown in FIG. 3b. Each of the sub-pixels 20 corresponds to an opening area of the mask 50. The via opening 31 of the isolation layer 30 is formed at the non-opening area of the mask 50.

In some embodiments, the opening area of the mask 50 is larger than the area of the sub-pixel 20 due to the alignment error of the screen of the mask 50 and the evaporation shadow, etc., thereby ensuring that the isolation layer 30 can completely cover the sub-pixels 20. Of course, the opening area of the mask 50 cannot be too large. Since the mask 50 has an evaporation shadow, if the opening area is too large, an isolation layer 30 may be formed within the intervals 60 between adjacent sub-pixels 20, thereby being disadvantageous to formation of the via openings 31 of the isolation layer 30.

In some embodiments, the sub-pixels 20 of the display substrate are arranged as shown in FIG. 4a, and the mask 50 forming the isolation layer 30 corresponding thereto is as shown in FIG. 4b. Each opening area of the mask 50 corresponds to three subpixels 20 separated with small intervals.

Figure 4C:
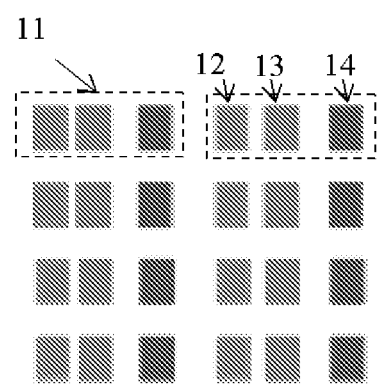
FIG. 4c is a top plan view showing arrangement of sub-pixels of an organic light emitting diode display substrate according to one embodiment of the present disclosure.

In some embodiments, as shown in FIG. 4c the plurality of sub-pixels constitutes a plurality of pixels 11, each of the plurality of pixels comprises a blue sub-pixel 12, a red sub-pixel 13, and a green sub-pixel 14, and the plurality of opening areas of the mask is in a one-to-one correspondence with the plurality of pixels, respectively.

Step S03 includes forming an auxiliary conductive layer 40.

In one embodiment, the auxiliary conductive layer 40 is formed by a chemical vapor deposition (CVD) or a sputtering technique.

The chemical vapor deposition or sputtering technique is usually performed under a high temperature environment, so that the influence of forming the auxiliary conductive layer 40 on the cathode and the light-emitting layer 22 may be relatively large. The display substrate of the embodiment of the present disclosure may avoid the adverse effect of the chemical vapor deposition or sputtering technique on the cathode and the light-emitting layer due to the presence of the isolation layer 30.

The auxiliary conductive layer 40 may be formed of a material such as indium tin oxide, indium zinc oxide, indium gallium zinc oxide or tin oxide.

Some embodiments of the present disclosure further provide a display panel, including the display substrate of any of the above embodiments.

It is easy to understand that the display panel may further include a structure such as a driving circuit. The driving circuit may be electrically connected to the second electrode layer. The power supply unit may be a chip electrically connected to the second electrode layer.

Specifically, the display panel can be any product or component with display function such as electronic paper, mobile phone, tablet computer, television, display, notebook computer, digital photo frame, navigator, and the like.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A display substrate, comprising:
    a base substrate;
    a plurality of sub-pixels in an array on the base substrate, wherein adjacent sub-pixels are separated by a pixel defining layer, each of the plurality of sub-pixels includes a first electrode, a light-emitting layer and a second electrode in a direction away from the base substrate, the second electrode of each of the plurality of sub-pixels is connected to one another to form a second electrode layer;
    an isolation layer on a side of the second electrode layer opposite from the light-emitting layer; and
    an auxiliary conductive layer directly disposed on a side of the isolation layer opposite from the second electrode layer,
    wherein the isolation layer comprises a via opening, orthographic projection of the via opening on the base substrate substantially overlaps with orthographic projection of the pixel defining layer on the base substrate, orthographic projection of the auxiliary conductive layer on the base substrate covers the orthographic projection of the pixel defining layer and orthographic projection of the light-emitting layer on the substrate, and the auxiliary conductive layer is connected to the second electrode layer through the via opening;
    the isolation layer is a capping layer, and a center area of the isolation layer in each of the plurality of sub-pixels is closer to the base substrate than an edge area of the isolation layer in each of the plurality of sub-pixels; and the via opening is located between two adjacent sub-pixels and surrounds each of the plurality of sub-pixels.

2. The display substrate of claim 1, wherein a thickness of the isolation layer is in a range from about 10 nm to about 90 nm.

3. The display substrate of claim 1, wherein the via opening locates between any two adjacent sub-pixels in the plurality of sub-pixels, and the plurality of sub-pixels are arranged along a first direction with an equal interval.

4. A display substrate, comprising:
a base substrate;
a plurality of sub-pixels in an array on the base substrate, wherein adjacent sub-pixels are separated by a pixel defining layer, each of the plurality of sub-pixels includes a first electrode, a light-emitting layer and a second electrode in a direction away from the base substrate, the second electrode of each of the plurality of sub-pixels is connected to one another to form a second electrode layer;
an isolation layer on a side of the second electrode layer opposite from the light-emitting layer; and
an auxiliary conductive layer directly disposed on a side of the isolation layer opposite from the second electrode layer,
wherein the isolation layer comprises a via opening, orthographic projection of the via opening on the base substrate substantially overlaps with orthographic projection of the pixel defining layer on the base substrate, orthographic projection of the auxiliary conductive layer on the base substrate covers the orthographic projection of the pixel defining layer and orthographic projection of the light-emitting layer on the substrate, and the auxiliary conductive layer is connected to the second electrode layer through the via opening;
the display substrate further includes a plurality of pixels arranged along a first direction with a pixel interval, each of the plurality of pixels includes a set of adjacent sub-pixels arranged along a first direction with a sub-pixel interval, the set of adjacent sub-pixels includes more than one sub-pixel, and the sub-pixel interval is shorter than the pixel interval, the via opening is located between two adjacent pixels but not between two adjacent sub-pixels of a same pixel and surrounds each of the plurality of pixels, and the set of adjacent sub-pixels and sub-pixel intervals between the adjacent sub-pixels are covered by the isolation layer.

5. The display substrate of claim 4, wherein each of the plurality of pixels comprises a blue sub-pixel, a red sub-pixel, and a green sub-pixel, and an interval between the blue sub-pixel and the red sub-pixel is smaller than an interval between the red sub-pixel and the green sub-pixel.

6. The display substrate of claim 1, wherein a material of the capping layer comprises molybdenum trioxide.

7. The display substrate of claim 1, wherein the display substrate is an organic light emitting diode display substrate, the first electrode is an anode, and the second electrode is a cathode.

8. The display substrate of claim 1, wherein the second electrode is a metal electrode, the auxiliary conductive layer is a transparent conductive layer, the isolation layer is a transparent isolation layer, and light emitted by the light-emitting layer is emitted from one side of the second electrode.

9. The display substrate of claim 1, wherein the auxiliary conductive layer comprises a material selected from the group consisting of indium tin oxide, indium zinc oxide, indium gallium zinc oxide and tin oxide.

10. A display panel, comprising the display substrate according to claim 1.

11. A display apparatus comprising the display panel of claim 10.

* * * * *